US006576492B2

(12) United States Patent
Chen et al.

(10) Patent No.: US 6,576,492 B2
(45) Date of Patent: Jun. 10, 2003

(54) PROCESS FOR MAKING SURFACE MOUNTABLE ELECTRICAL DEVICES

(75) Inventors: Jack Jih-Sang Chen, Taipei (TW); Chung-Ta Tseng, Taipei Hsien (TW); Chi-Hao Gu, Pan-Chiao (TW)

(73) Assignee: Fuzetec Technology Co., Ltd., Taipei Hsien (TW)

( * ) Notice: Subject to any disclaimer, the term of this patent is extended or adjusted under 35 U.S.C. 154(b) by 64 days.

(21) Appl. No.: 10/014,627

(22) Filed: Oct. 22, 2001

(65) Prior Publication Data

US 2003/0077851 A1 Apr. 24, 2003

(51) Int. Cl.$^{7}$ .............................................. H01L 21/44
(52) U.S. Cl. ..................................... 438/106; 338/22 R
(58) Field of Search ........................ 438/106; 338/22 R, 338/328; 252/514

(56) References Cited

U.S. PATENT DOCUMENTS 5,852,397 A * 12/1998 Chan et al. ............... 338/22 R
6,020,808 A * 2/2000 Hogge ...................... 338/22 R
6,157,289 A 12/2000 Kojima et al.
6,285,275 B1 * 9/2001 Chen et al. ............... 338/22 R

* cited by examiner

*Primary Examiner*—John F. Niebling
*Assistant Examiner*—Christopher Lattin
(74) *Attorney, Agent, or Firm*—Merchant & Gould P.C.

(57) ABSTRACT

A process for making surface mountable electrical devices includes the steps of laminating two PTC sheets, two inner metal foil sheets, and two outer metal foil sheets to form a laminate such that the inner metal foil sheets are sandwiched between the PTC sheets and overlap each other and that the PTC sheets are bonded to each other, forming patterns of slits in the outer metal foil sheets, forming bores in the laminate along cutting lines, forming conductive transverse layers in interiors of the bores, and cutting the laminate along the cutting lines.

3 Claims, 17 Drawing Sheets

PROCESS FOR MAKING SURFACE MOUNTABLE ELECTRICAL DEVICES

CROSS-REFERENCE TO RELATED APPLICATION

This application is related to co-pending U.S. patent application Ser. No. 09/934275, filed by the applicant on Aug. 21, 2001.

BACKGROUND OF THE INVENTION

1. Field of the Invention

This invention relates to a process for making surface mountable electrical devices.

2. Description of the Related Art

FIG. 1 illustrates a conventional surface mountable electrical device, such as a PTC thermistor, which includes a plurality of stacked PTC sheets 4 that have a positive thermal coefficient characteristic, a plurality of metal foil sheets 21, 23 alternately laminated with the PTC sheets 4, a first electrode layer 22 formed on an upper surface of the device, a second electrode layer 24 formed on a bottom surface of the device, a conductive first side layer 51 interconnecting the first electrode layer 22 and one of the metal foil sheets 23, and a conductive second side layer 52 interconnecting the second electrode layer 24 and another one of the metal foil sheets 21. Commercially available metal foil sheets, which are made from copper, normally have been surface treated at one side face so as to be attachable to a contacting surface of a PTC sheet. However, the other side face of each of the metal foil sheets is not surface treated and is relatively smooth. As a result, the non-surface-treated side face of each of the aforesaid metal foil sheets 21, 23 is in poor contact with the respective PTC sheet 4, and thus tends to peel from the respective PTC sheet 4.

In order to overcome the aforementioned drawback, U.S. Pat. No. 6,157,289 disclosed a surface mountable electrical device (see FIG. 2) that includes a metal foil sheet 11, which is sandwiched between two stacked PTC sheets 14 and which is surface treated by plating with nickel layers 12 on opposite side faces thereof so as to roughen the side faces and so as to permit secure attachment of the same to contacting surfaces of the PTC sheets 14. However, the extra processing step of forming the nickel layers 12 significantly increases the cost of manufacture. Moreover, the metal foil sheet 11 is required to be formed with grooves along cutting lines by etching or die press prior to being laminated with the PTC sheets 14 for facilitating formation of pieces of the surface mountable electrical device in a subsequent cutting step.

SUMMARY OF THE INVENTION

Therefore, the object of the present invention is to provide a process for making surface mountable electrical devices that is capable of overcoming the aforementioned drawbacks.

According to the present invention, a process for making surface mountable electrical devices comprises the steps of: preparing at least first and second PTC sheets which have a positive thermal coefficient characteristic and each of which has opposite first and second contact faces; respectively covering the first and second contact faces of each of the first and second PTC sheets with outer and inner metal foil sheets; selectively masking the inner metal foil sheet on each of the first and second PTC sheets to define a pattern of exposed areas on the inner metal foil sheet; removing portions of the inner metal foil sheet on each of the first and second PTC sheets at the exposed areas so as to define a pattern of non-inlaid portions of the second contact face of each of the first and second PTC sheets, the non-inlaid portions being exposed from the inner metal foil sheets; laminating the first and second PTC sheets and the outer and inner metal foil sheets to form a laminate such that the non-inlaid portions of the second contact face of the first PTC sheet are respectively bonded to the non-inlaid portions of the second contact face of the second PTC sheet and that the inner metal foil sheet on the first PTC sheet overlaps the inner metal foil sheet on the second PTC sheet; selectively masking the outer metal foil sheet on the first contact face of the first PTC sheet to define a pattern of exposed areas on the outer metal foil sheet on the first PTC sheet; removing portions of the outer metal foil sheet on the first PTC sheet at the exposed areas so as to define a pattern of slits in the outer metal foil sheet on the first PTC sheet; forming a plurality of bores in the laminate along intersecting cutting lines at locations where the cutting lines intersect, each of the bores extending from the outer metal foil sheet on the first PTC sheet to the outer metal foil sheet on the second PTC sheet in a transverse direction relative to the first and second contact faces; forming a conductive transverse layer in an interior of each of the bores such that the transverse layer extends from the outer metal foil sheet on the first PTC sheet to the outer metal foil sheet on the second PTC sheet; and cutting the laminate along the cutting lines to form a plurality of the surface mountable electrical devices such that the outer metal foil sheet on the first PTC sheet on each of the surface mountable electrical devices forms opposing first and second segments which are spaced apart by a respective one of the slits and that the transverse layer on each of the surface mountable electrical devices is electrically connected to the first segment of the outer metal foil sheet on the first PTC sheet, the inner metal foil sheets, and the outer metal foil sheet on the second PTC sheet.

BRIEF DESCRIPTION OF THE DRAWINGS

In drawings which illustrate embodiments of the invention.

DETAILED DESCRIPTION OF THE PREFERRED EMBODIMENTS

Figure 3:
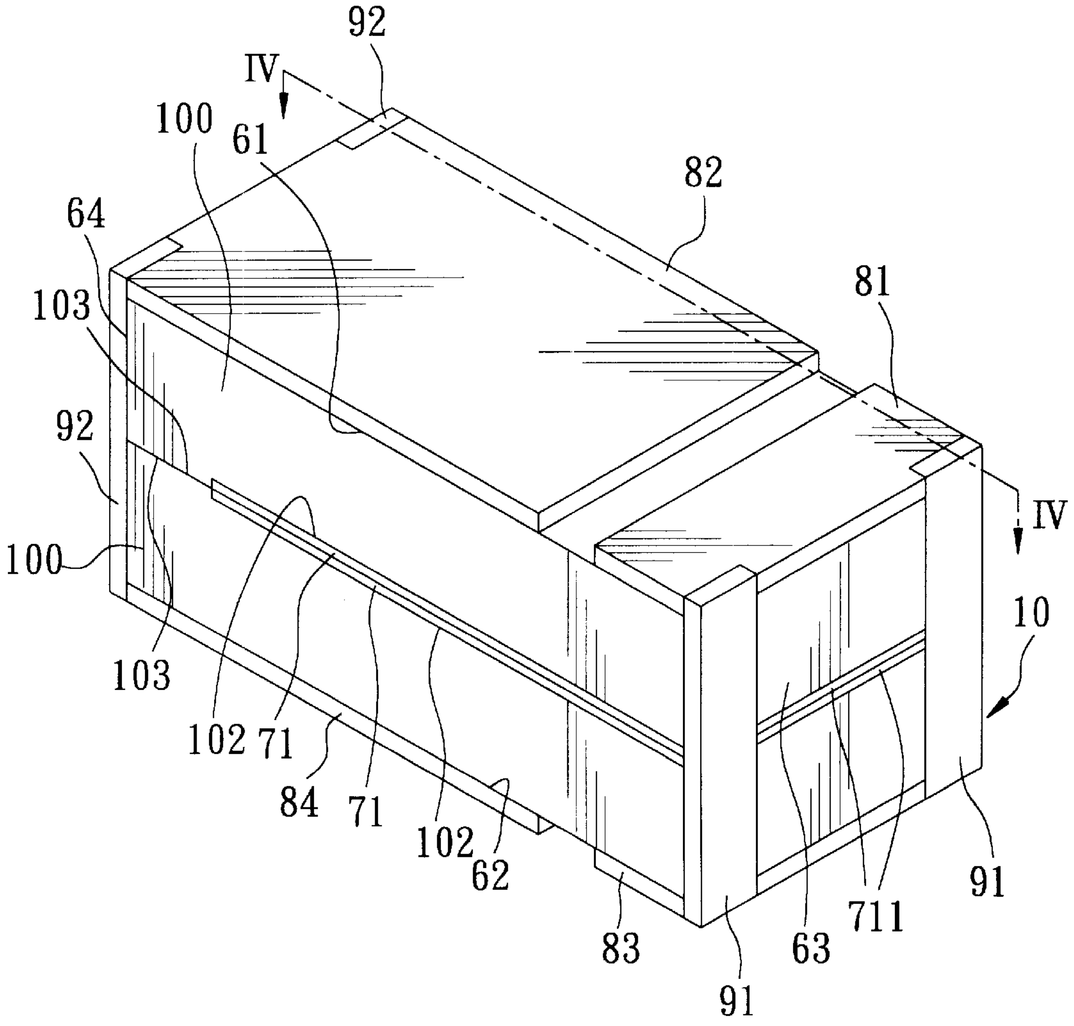
FIG. 3 is a perspective view of a first preferred embodiment of a surface mountable electrical device of this invention.
Figure 4:
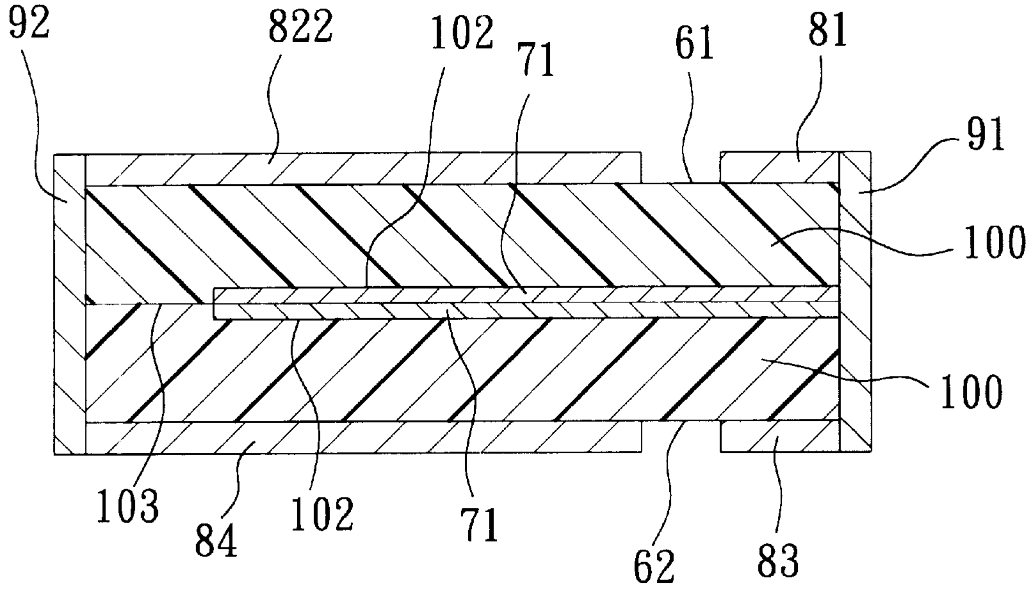
FIG. 4 is a sectional view of the first preferred embodiment, taken along line IV—IV in FIG. 3.

FIGS. 3 and 4 illustrate a first embodiment of a surface mountable electrical device of this invention. The surface mountable electrical device includes: a laminate body 10 having top and bottom faces 61, 62 and opposite first and second side faces 63, 64 transverse to and interconnecting the top and bottom faces 61, 62, the laminate body 10 including a plurality of stacked PTC sheets 100 which have a positive thermal coefficient characteristic, two overlapping first metal foil sheets 71 sandwiched between each two adjacent ones of the PTC sheets 100 and having contact ends 711 that extend to and that are exposed from the first side face 63, a conductive first electrode layer 81 formed on the top face 61, a conductive second electrode layer 82 formed on the top face 61 and spaced apart from the first electrode layer 81, and a conductive third electrode layer 83 formed on the bottom face 62; and two conductive first transverse layers 91 formed on the first side face 63 and interconnecting the first and third electrode layers 81, 83 and the contact ends 711 of the first metal foil sheets 71. Each two adjacent ones of the PTC sheets 100 have contact faces with first inlaid portions 102 respectively inlaid with the first metal foil sheets 71, and non-inlaid portions 103 bonded to each other. The laminate body 10 is formed by thermally pressing the PTC sheets 100, the first metal foil sheets 71, and the first, second and third electrode layers 81, 82, 83 so as to permit the PTC sheets 100 to be inlaid with the first metal foil sheets 71 and the non-inlaid portions 103 of the contact faces of the PTC sheets 100 to be bonded together. The first transverse layers 91 can be formed by conventional plating techniques.

The laminate body 1 can further include a conductive fourth electrode layer 84 that is formed on the bottom face 62 and that is spaced apart from the third electrode layer 83. Two conductive second transverse layers 92 are formed on the second side face 64, interconnect the second and fourth electrode layers 82, 84, and are spaced apart from the first metal foil sheets 71 by the non-inlaid portions 103 of the contact faces of the PTC sheets 100.

Figure 5:
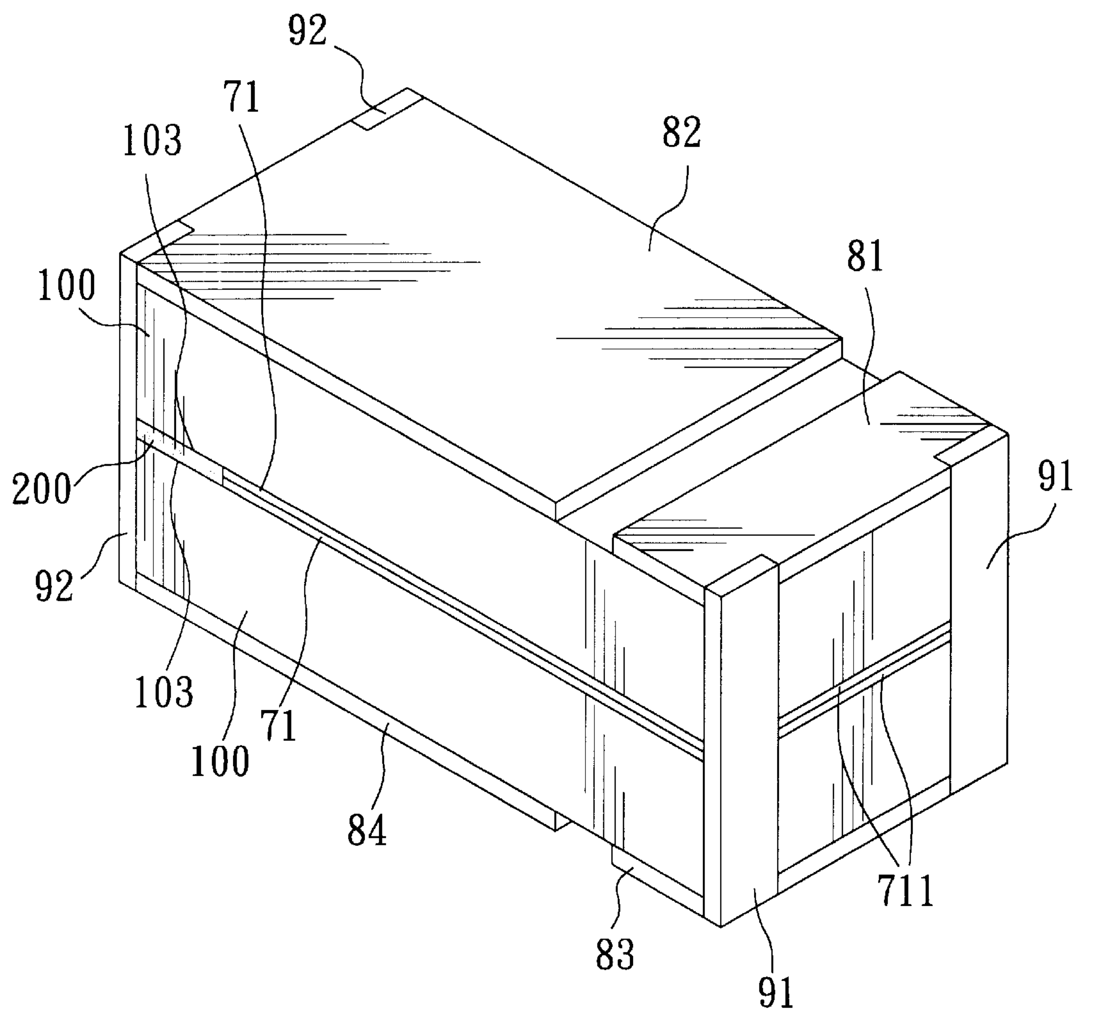
FIG. 5 is a perspective view of a second preferred embodiment of a surface mountable electrical device of this invention.

FIG. 5 illustrates a second embodiment of the surface mountable electrical device of this invention, which has a configuration similar to that of the previous embodiment shown in FIG. 3, except that an adhesive layer 200 is coated on the non-inlaid portions 103 of the contact faces of each two adjacent ones of the PTC sheets 100 so as to enhance the bonding strength therebetween.

Figure 6:
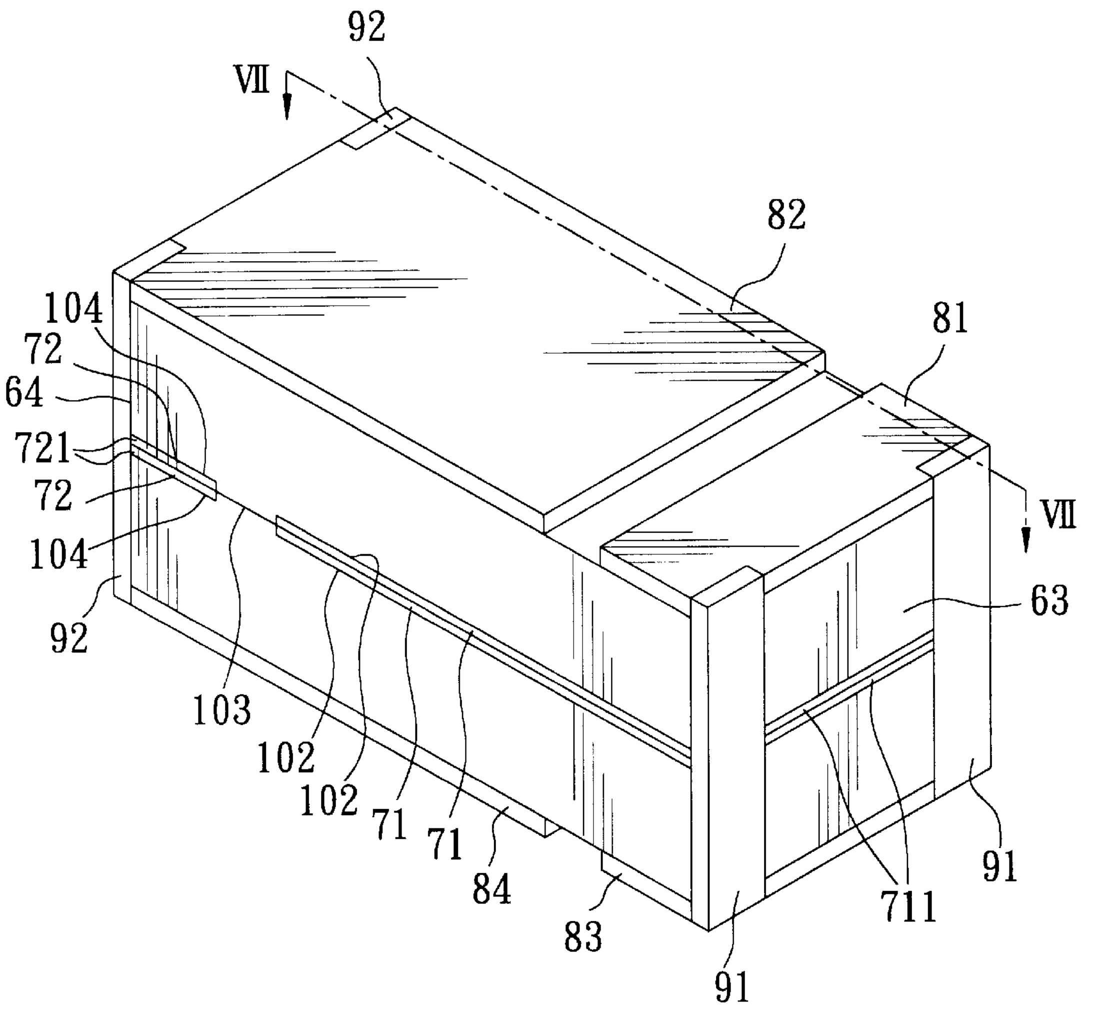
FIG. 6 is a perspective view of a third preferred embodiment of a surface mountable electrical device of this invention.
Figure 7:
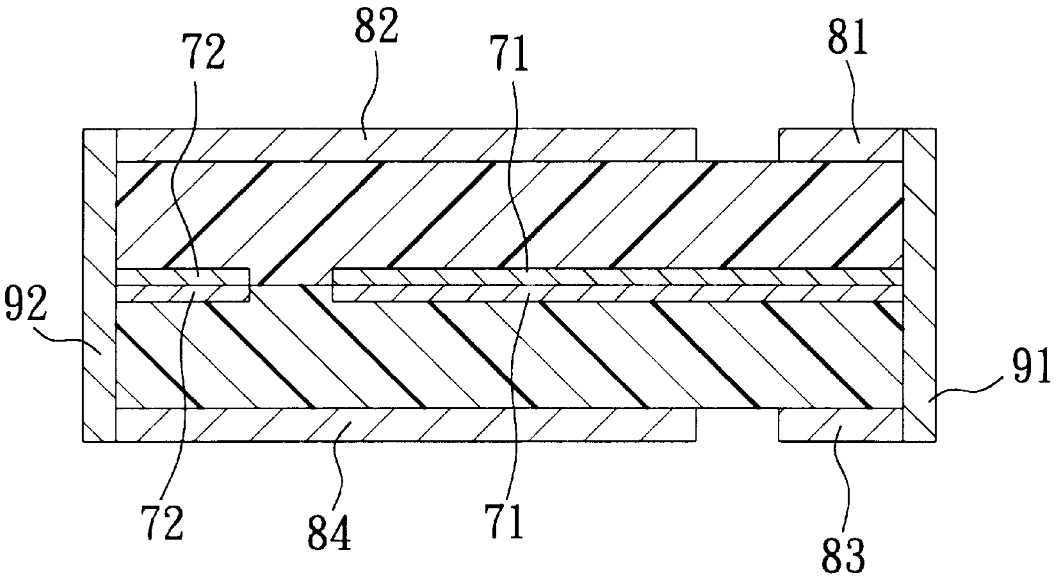
FIG. 7 is a sectional view of the third preferred embodiment, taken along line VII—VII in FIG. 6.

FIGS. 6 and 7 illustrate a third embodiment of the surface mountable electrical device of this invention, which has a configuration similar to that of the previous embodiment shown in FIG. 3, except that two overlapping second metal foil sheets 72 are sandwiched between each two adjacent ones of the PTC sheets 100 and have contact ends 721 that extend to and that are exposed from the second side face 64 so as to be connected to the second transverse layers 92. The contact faces of each two adjacent ones of the PTC sheets 100 further have second inlaid portions 104 that are respectively inlaid with the second metal foil sheets 72. The first and second metal foil sheets 71, 72 are spaced apart by the non-inlaid portions 103 of the contact faces of the PTC sheets 100.

Figure 1:
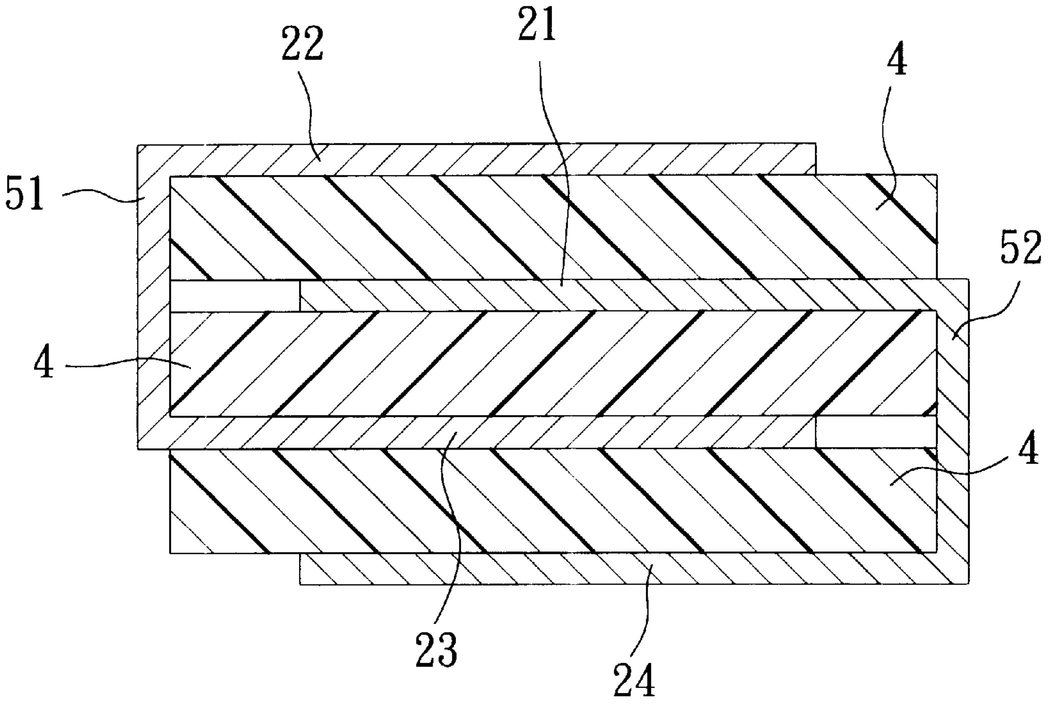
FIG. 1 PRIOR ART
FIG. 1 is a cross-sectional view of a conventional surface mountable electrical device.
Figure 2:
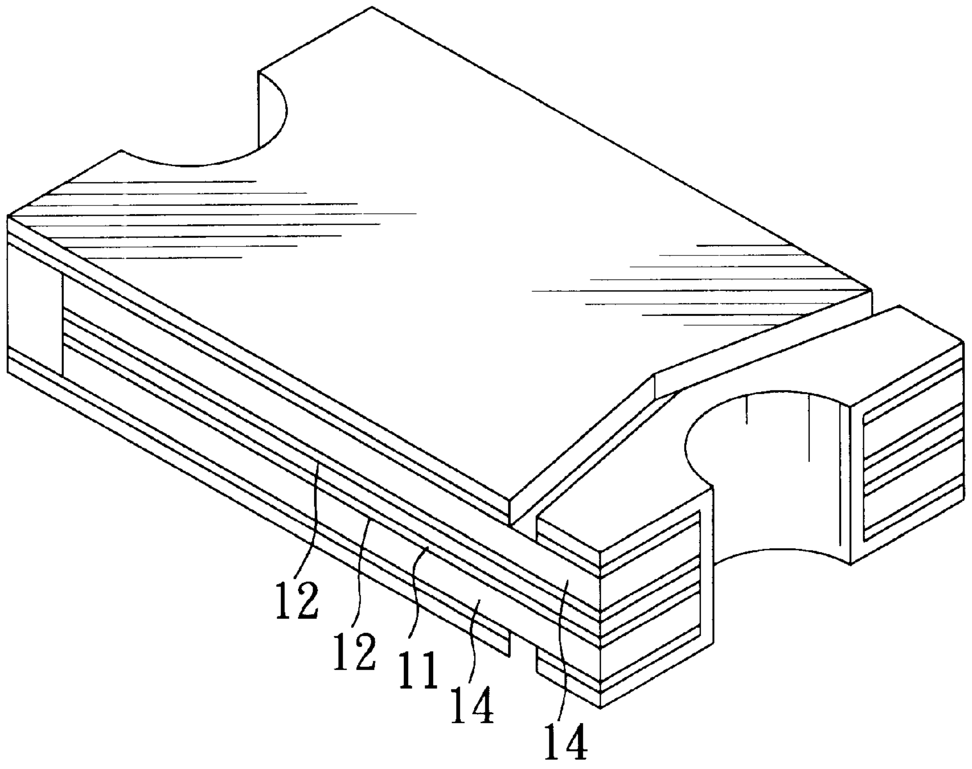
FIG. 2 PRIOR ART
FIG. 2 is a perspective partly sectioned view of another conventional surface mountable electrical device.

The first and second metal foil sheets 71, 72 are commercially available, and each of which has one side face that is surface treated and that is attached securely to the inlaid portion 102 of the contact face of a respective one of the PTC sheets 100, and an opposite side face that is not surface treated and that is in contact with an adjacent one of the first and second metal foil sheets 71, 72. Because they are made of the same material, the two overlapping first or second metal foil sheets 71, 72 are in better surface contact as compared to that between the PTC sheet and the metal foil utilized in the prior art (see FIG. 1). Moreover, because of the non-inlaid portions 103 of the contact faces of the PTC sheets 100, each two adjacent ones of the PTC sheets 100 can be bonded together via thermal-pressing techniques, thereby eliminating the drawbacks as encountered in the prior art (see FIGS. 1 and 2).

Figure 8:
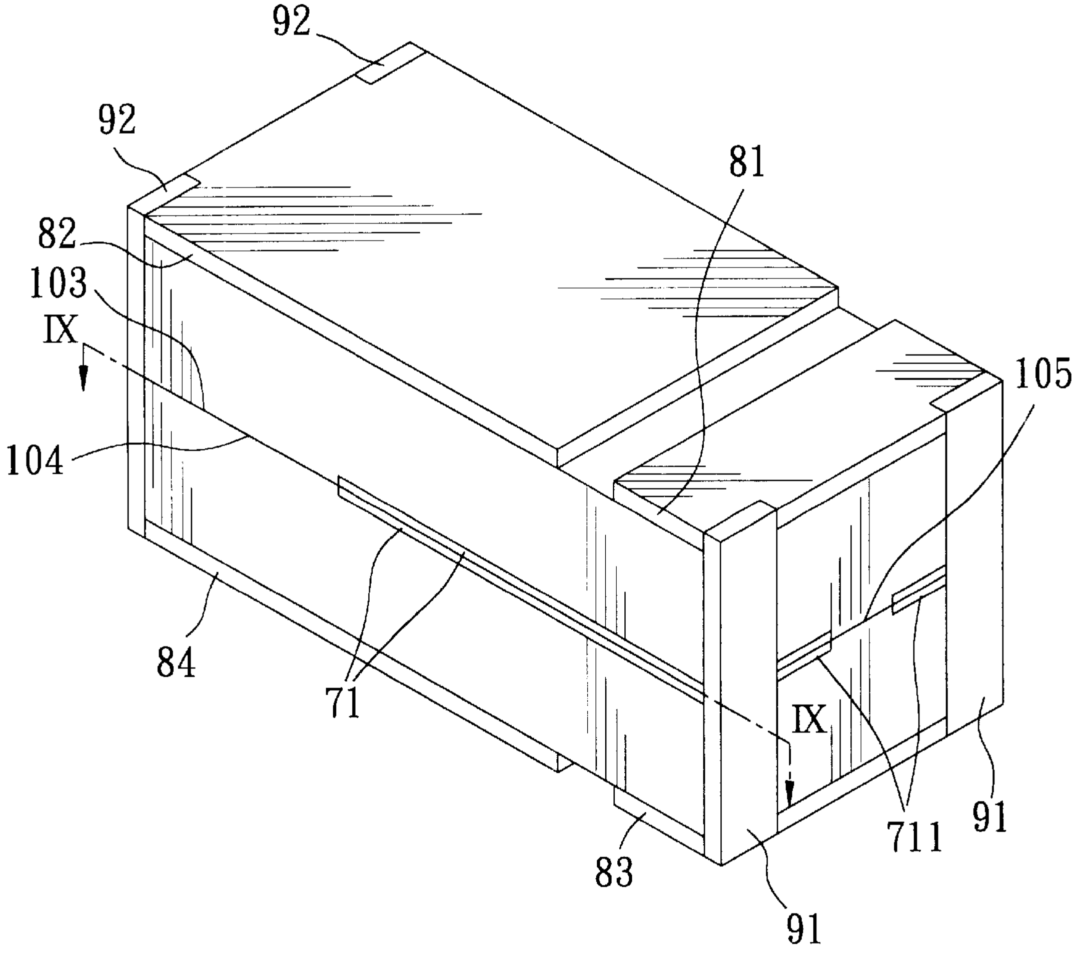
FIG. 8 is a perspective view of a fourth preferred embodiment of a surface mountable electrical device of this invention.
Figure 9:
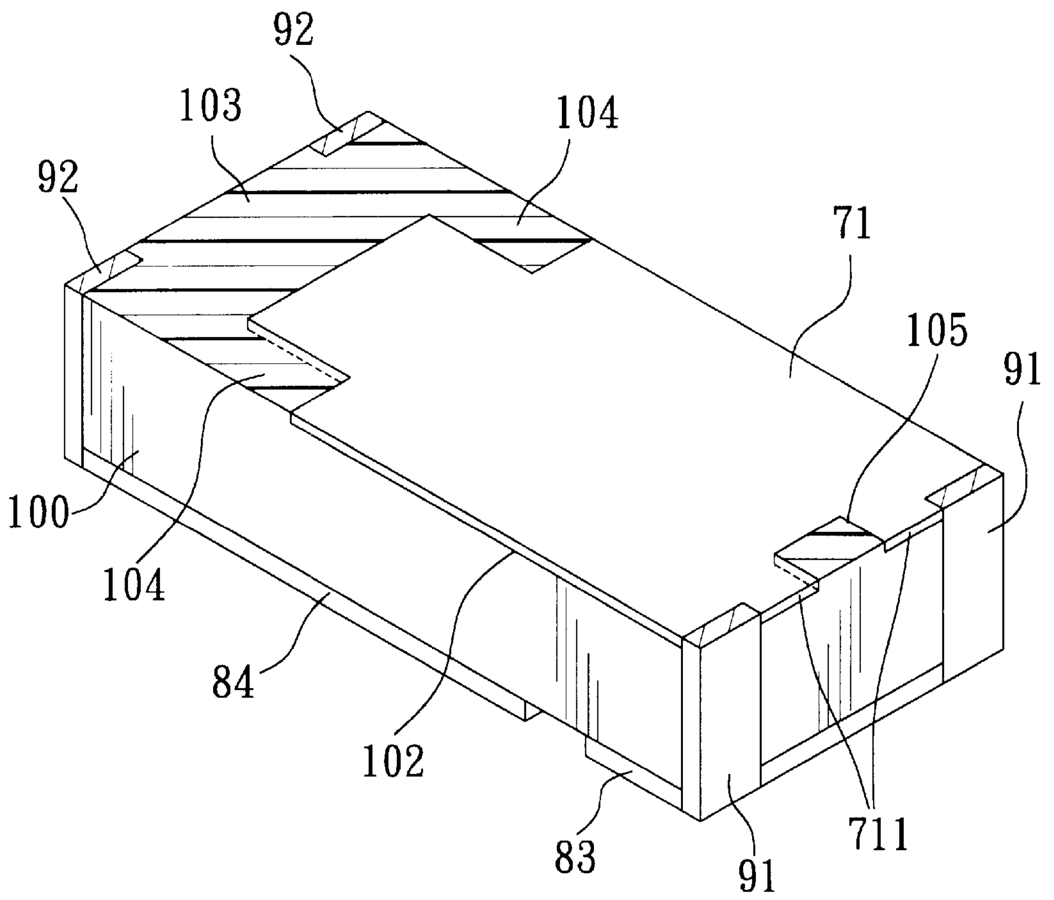
FIG. 9 is a sectional view of the fourth preferred embodiment, taken along line VII—VII in FIG. 8.
Figure 10:
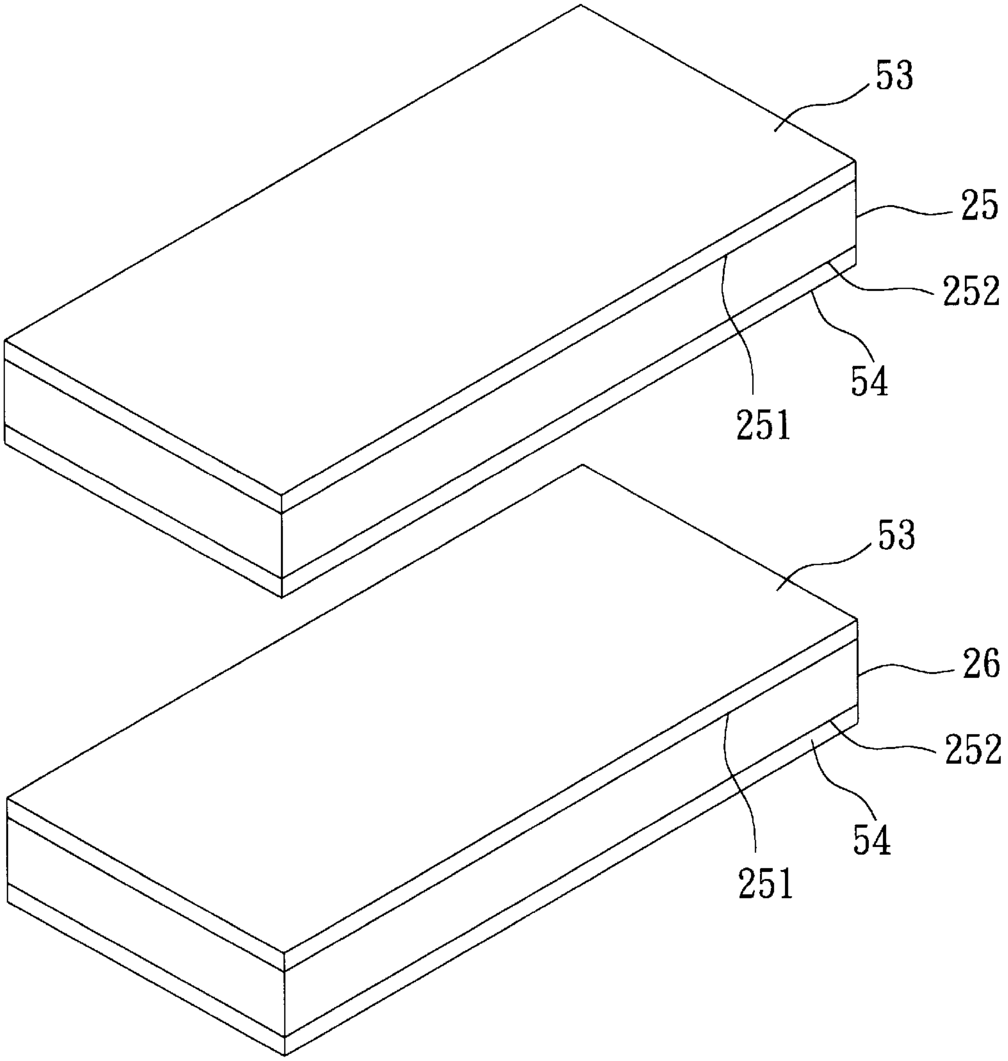
FIG. 10 is a schematic view to illustrate preparation of two PTC sheets and metal foil sheets according to a process for making the surface mountable electrical device of FIG. 3.
Figure 11:
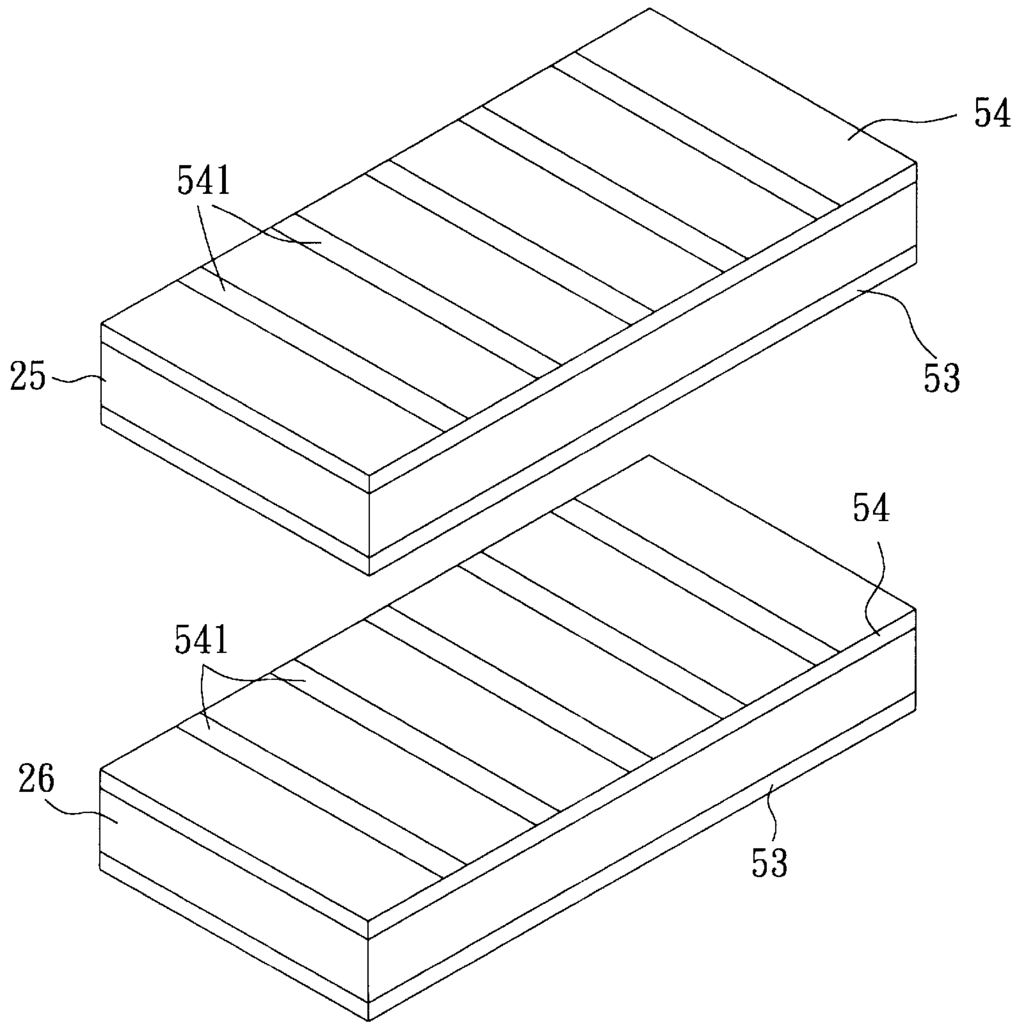
FIGS. 11 and 12 are schematic views to illustrate patterning of non-inlaid portions on contact faces of the PTC sheets according to the process of this invention.
Figure 12:
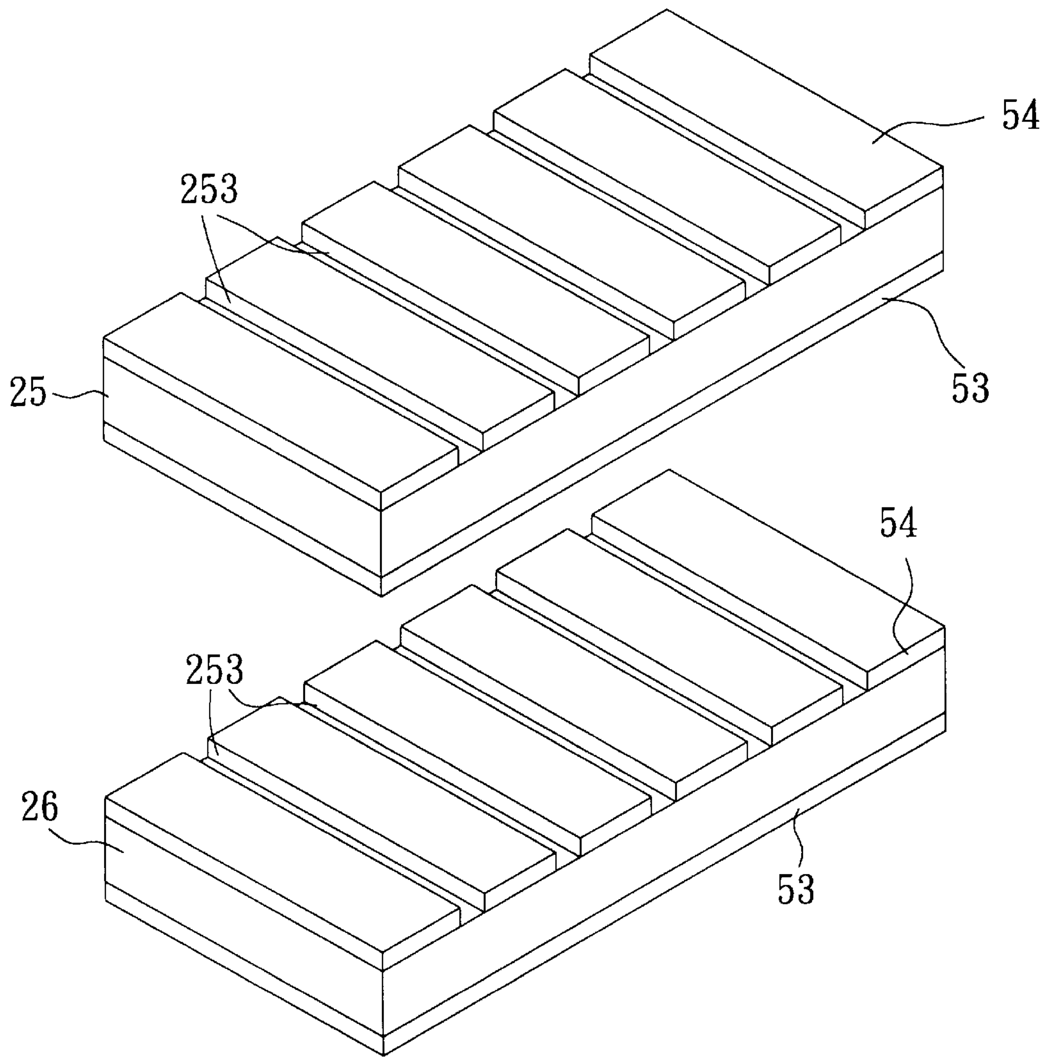
Figure 13:
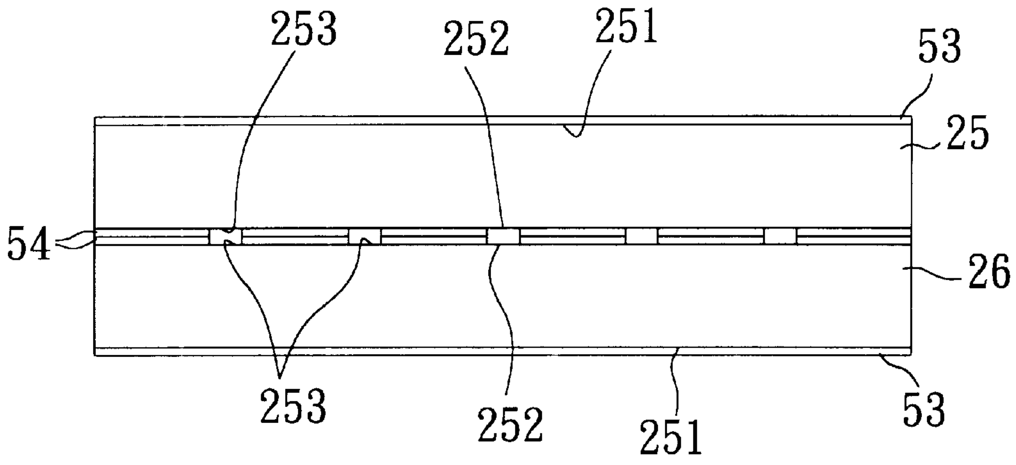
FIGS. 13 and 14, are schematic side views to illustrate laminating of the PTC sheets and the metal foil sheets according to the process of this invention.
Figure 14:
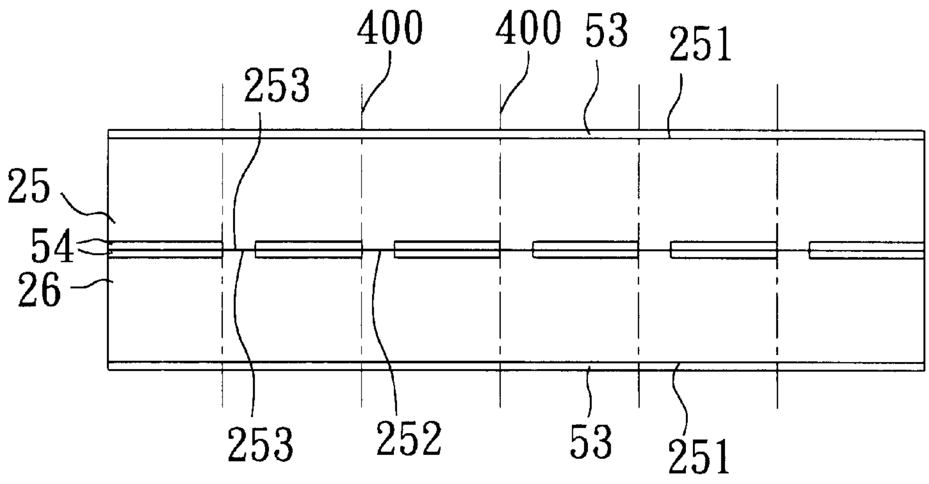
Figure 15:
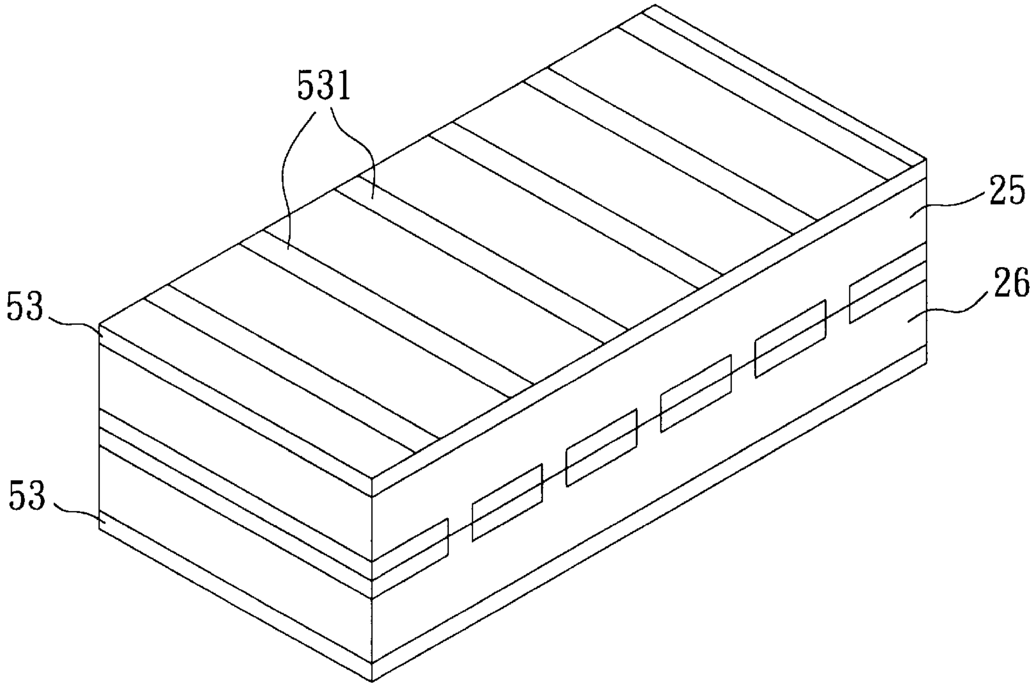
FIGS. 15 and 16 are schematic views to illustrate patterning of slits in the metal foil sheets according to the process of this invention.
Figure 16:
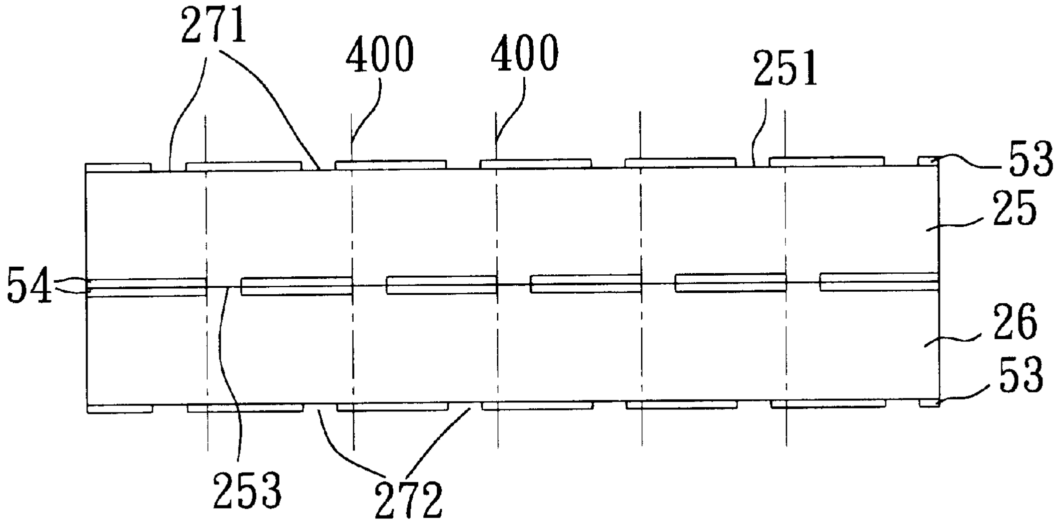
Figure 17:
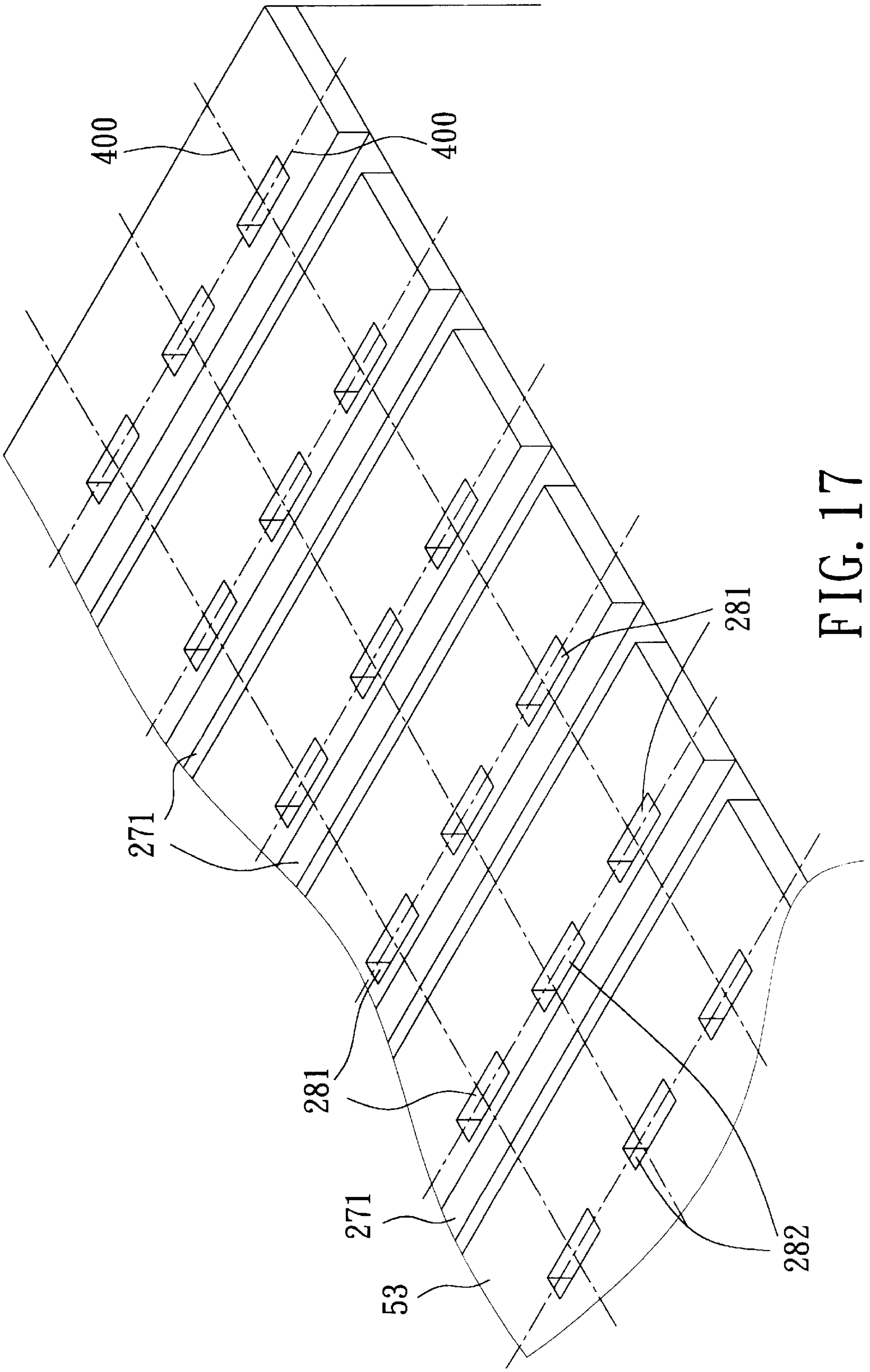
FIG. 17 is a schematic top view to illustrate formation of bores in the assembly of the PTC sheets and the metal foil sheets according to the process of this invention.
Figure 18:
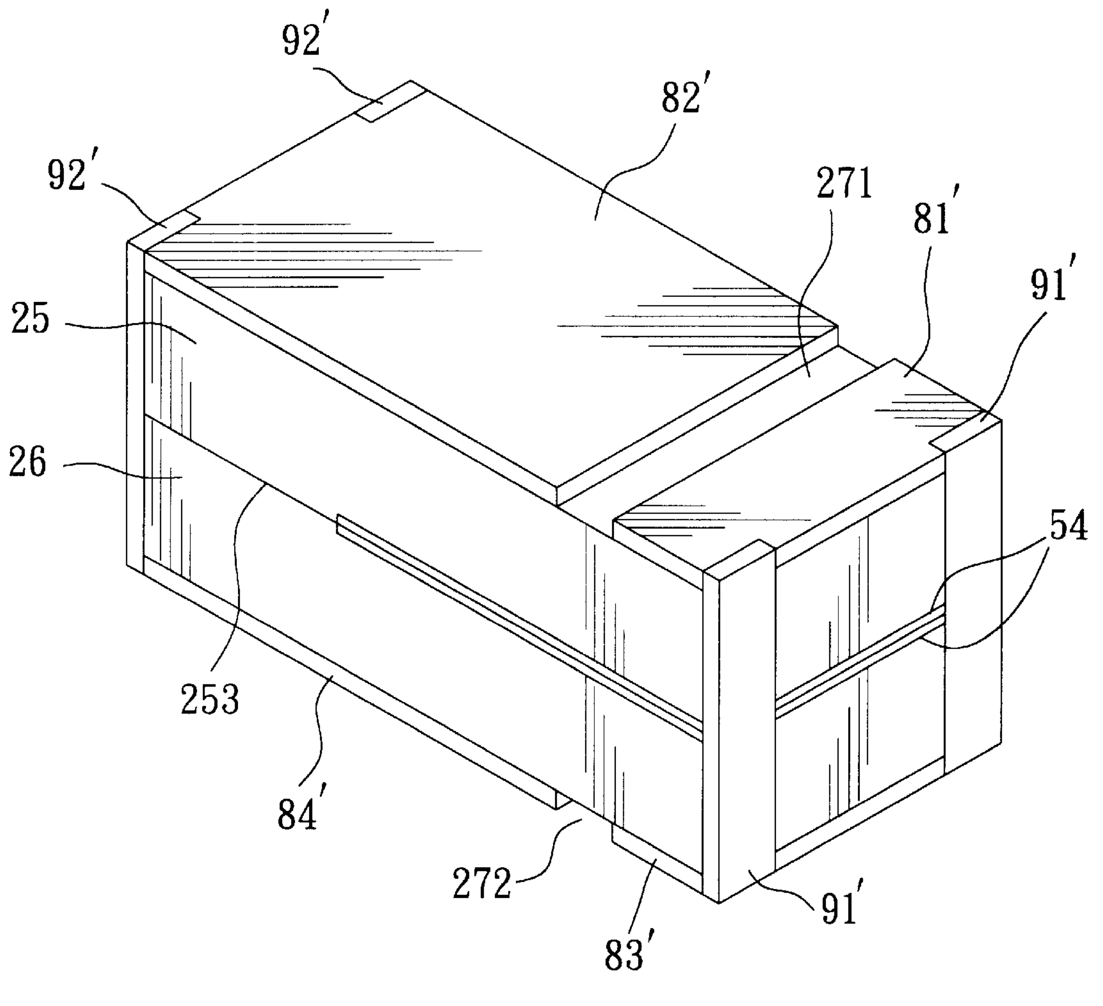
FIG. 18 is a schematic perspective view to illustrate formation of conductive transverse layers in interiors of the bores according to the process of this invention.

The bonding strength between each two adjacent ones of the PTC sheets 100 is dependent on the contact area therebetween. FIGS. 8 and 9 illustrate a fourth embodiment of the surface mountable electrical device of this invention, which has a configuration similar to that of the first embodiment shown in FIG. 3, except that the contact face of each PTC sheet 100 further has additional non-inlaid portions 104, 105 so as to increase the contact area between each two adjacent ones of the PTC sheets 100 and so as to enhance the bonding strength therebetween.

FIGS. 10 to 18 illustrate consecutive steps according to a process of this invention for making the surface mountable electrical device of FIG. 3. The process includes the steps of: preparing at least first and second PTC sheets 25, 26 which have a positive thermal coefficient characteristic and each of which has opposite first and second contact faces 251, 252; respectively covering the first and second contact faces 251, 252 of each of the first and second PTC sheets 25, 26 with outer and inner metal foil sheets 53, 54; selectively masking the inner metal foil sheet 54 on each of the first and second PTC sheets 25, 26 to define a pattern of exposed areas 541 on the inner metal foil sheet 54; removing portions of the inner metal foil sheet 54 on each of the first and second PTC sheets 25, 26 at the exposed areas 541 so as to define a pattern of non-inlaid portions 253 of the second contact face 252 of each of the first and second PTC sheets 25, 26 (see FIG. 12) via etching techniques, the non-inlaid portions 253 being exposed from the inner metal foil sheets 54; laminating the first and second PTC sheets 25, 26 and the outer and inner metal foil sheets 53, 54 to form a laminate such that the non-inlaid portions 253 of the second contact face 252 of the first PTC sheet 25 are respectively bonded to the non-inlaid portions 253 of the second contact face 252 of the second PTC sheet 26 and that the inner metal foil sheet 54 on the first PTC sheet 25 overlaps the inner metal foil sheet 54 on the second PTC sheet 26 (see FIG. 14); selectively masking the outer metal foil sheets 53 on the first contact faces 251 of the first and second PTC sheets 25, 26 to define patterns of exposed areas 531 on the outer metal foil sheets 53 on the first and second PTC sheets 25, 26, respectively; removing portions of the outer metal foil sheets 53 on the first and second PTC sheets 25, 26 at the exposed areas so as to define patterns of first and second slits 271, 272 in the outer metal foil sheets 53 on the first and second PTC sheets 25, 26, respectively (see FIG. 16) via etching techniques; forming a plurality of first and second bores 281, 282 in the laminate along intersecting cutting lines 400 at locations where the cutting lines 400 intersect, each of the first and second bores 281, 282 extending from the outer metal foil sheet 53 on the first PTC sheet 25 to the outer metal foil sheet 53 on the second PTC sheet 26 in a transverse direction relative to the first and second contact faces 251, 252; forming conductive first and second transverse layers 91', 92' in interiors of the first and second bores 281, 282, respectively, such that the first and second transverse layers 91', 92' extend from the outer metal foil sheet 53 on the first PTC sheet 25 to the outer metal foil sheet 53 on the second PTC sheet 26, the first and second transverse layers 91', 92' corresponding to the first and second transverse layers 91, 92 in FIG. 3; and cutting the laminate along the cutting lines 400 to form a plurality of the surface mountable electrical devices of FIG. 3 such that the outer metal foil sheet 53 on the first PTC sheet 25 on each of the surface mountable electrical devices forms opposing first and second segments 81', 82' which are spaced apart by a respective one of the first slits 271, that the outer metal foil sheet 53 on the second PTC sheet 26 on each of the surface mountable electrical devices forms opposing third and fourth segments 83', 84' which are spaced apart by a respective one of the second slits 272, that the first transverse layer 91' on each of the surface mountable electrical devices is electrically connected to the first segment 81' of the outer metal foil sheet 53 on the first PTC sheet 25, the inner metal foil sheets 54, and the third segment 83' of the outer metal foil sheet 53 on the second PTC sheet 26, and that the second transverse layer 92' on each of the surface mountable electrical devices is electrically connected to the second segment 82' of the outer metal foil sheet 53 on the first PTC sheet 25 and the fourth segment 84' of the outer metal foil sheet 53 on the second PTC sheet 26. The first, second, third, and fourth segments 81', 82', 83', 84' of the outer metal foil sheets 53 respectively correspond to the first, second, third, and fourth electrode layers 81, 82, 83, 84 in FIG. 3. The inner metal foil sheets 54 correspond to the first metal foil sheets 71 in FIG. 3.

The process of this invention can optionally include a step of applying an adhesive material to the non-inlaid portions 253 of the second contact faces 252 of the first and second PTC sheets 25, 26 before the step of laminating the assembly of the first and second PTC sheets 25, 26 and the outer and inner metal foil sheets 53, 54 for making the surface mountable electrical device of FIG. 5. Moreover, the cutting lines 400 can be left shifted from the positions in FIG. 16 to positions that pass through the inner metal foil sheets 54 for forming the spaced apart first and second metal foil sheets 71, 72 of the surface mountable electrical device of FIG. 6.

With the invention thus explained, it is apparent that various modifications and variations can be made without departing from the spirit of the present invention. It is therefore intended that the invention be limited only as recited in the appended claims.

We claim:

1. A process for making surface mountable electrical devices, comprising the steps of:

preparing at least first and second PTC sheets which have a positive thermal coefficient characteristic and each of which has opposite first and second contact faces;

respectively covering said first and second contact faces of each of said first and second PTC sheets with outer and inner metal foil sheets;

selectively masking said inner metal foil sheet on each of said first and second PTC sheets to define a pattern of exposed areas on said inner metal foil sheet;

removing portions of said inner metal foil sheet on each of said first and second PTC sheets at said exposed areas so as to define a pattern of non-inlaid portions of said second contact face of each of said first and second PTC sheets, said non-inlaid portions being exposed from said inner metal foil sheets;

laminating said first and second PTC sheets and said outer and inner metal foil sheets to form a laminate such that said non-inlaid portions of said second contact face of said first PTC sheet are respectively bonded to said non-inlaid portions of said second contact face of said second PTC sheet and that said inner metal foil sheet on said first PTC sheet overlaps said inner metal foil sheet on said second PTC sheet;

selectively masking said outer metal foil sheet on said first contact face of said first PTC sheet to define a pattern of exposed areas on said outer metal foil sheet on said first PTC sheet;

removing portions of said outer metal foil sheet on said first PTC sheet at said exposed areas so as to define a pattern of first slits in said outer metal foil sheet on said first PTC sheet;

forming a plurality of first bores in said laminate along intersecting cutting lines at locations where said cutting lines intersect, each of said first bores extending from said outer metal foil sheet on said first PTC sheet to said outer metal foil sheet on said second PTC sheet in a transverse direction relative to said first and second contact faces;

forming a conductive first transverse layer in an interior of each of said first bores such that said first transverse layer extends from said outer metal foil sheet on said first PTC sheet to said outer metal foil sheet on said second PTC sheet; and cutting said laminate along said cutting lines to form a plurality of said surface mountable electrical devices such that said outer metal foil sheet on said first PTC sheet on each of said surface mountable electrical devices forms opposing first and second segments which are spaced apart by a respective one of said first slits and that said first transverse layer on each of said surface mountable electrical devices is electrically connected to said first segment of said outer metal foil sheet on said first PTC sheet, said inner metal foil sheets, and said outer metal foil sheet on said second PTC sheet.

2. The process of claim 1, further comprising:

selectively masking said outer metal foil sheet on said first contact face of said second PTC sheet to define a pattern of exposed areas on said outer metal foil sheet on said second PTC sheet, and a step of removing portions of said outer metal foil sheet on said second PTC sheet at said exposed areas so as to define a pattern of second slits in said outer metal foil sheet on said second PTC sheet before formation of said first bores.

3. The process of claim 2, further comprising:

forming a plurality of second bores in said laminate along said intersecting cutting lines, each of said second bores extending from said outer metal foil sheet on said first PTC sheet to said outer metal foil sheet on said second PTC sheet in a transverse direction relative to said first and second contact faces; and forming a conductive second transverse layer in an interior of each of said second bores such that said second transverse layer extends from said outer metal foil sheet on said first PTC sheet to said outer metal foil sheet on said second PTC sheet before the cutting of said laminate, said outer metal foil sheet on said second PTC sheet on each of said surface mountable electrical devices forming opposing third and fourth segments which are spaced apart by a respective one of said second slits after the cutting of said laminate, said second transverse layer on each of said surface mountable electrical devices being electrically connected to said second segment of said outer metal foil sheet on said first PTC sheet and said fourth segment of said outer metal foil sheet on said second PTC sheet, said first transverse layer on each of said surface mountable electrical devices being electrically connected to said first segment of said outer metal foil sheet on said first PTC sheet, said inner metal foil sheets, and said third segment of said outer metal foil sheet on said second PTC sheet.

* * * * *